United States Patent [19]

Lechner et al.

[11] 4,316,236

[45] Feb. 16, 1982

[54] HINGED SUPPORT FOR ELECTRICAL DEVICES

[75] Inventors: Ernst-Friedrich Lechner; Otto Meusel, both of Erlangen; Meinhardt Müller, Grossenseebach, all of Fed. Rep. of Germany

[73] Assignee: Siemens Aktiengesellschaft, Munich, Fed. Rep. of Germany

[21] Appl. No.: 72,638

[22] Filed: Sep. 6, 1979

[30] Foreign Application Priority Data

Sep. 27, 1978 [DE] Fed. Rep. of Germany ....... 2842034

[51] Int. Cl.³ ............................................. H05K 7/20
[52] U.S. Cl. .................................... 361/429; 361/386; 361/394; 361/412; 16/390
[58] Field of Search ............... 361/331, 380, 381, 386, 361/393, 394, 412, 413, 415, 427, 428, 429; 211/26, 41, 47, 48; 16/162; 248/282; 200/307; 165/185

[56] References Cited

U.S. PATENT DOCUMENTS

| | | | |
|---|---|---|---|
| 3,131,330 | 4/1964 | Allen | 361/415 |
| 3,376,479 | 4/1968 | Wines | 361/393 |
| 3,662,225 | 5/1972 | Carter | 361/412 |
| 3,755,716 | 8/1973 | Yoshii | 361/429 |
| 4,161,017 | 7/1979 | Pierce | 361/412 |

FOREIGN PATENT DOCUMENTS

| | | | |
|---|---|---|---|
| 2138375 | 2/1973 | Fed. Rep. of Germany. | |
| 2710432 | 9/1978 | Fed. Rep. of Germany | 361/386 |
| 14220 | 7/1925 | Netherlands | 16/162 |

*Primary Examiner*—Gerald P. Tolin
*Attorney, Agent, or Firm*—Kenyon & Kenyon

[57] ABSTRACT

A mounting structure for boards that can be equipped with electronic devices has structurally identical, adjacent frames, which are linked to each other on right angle lugs and can be flipped open like the pages of a book.

15 Claims, 12 Drawing Figures

U.S. Patent  Feb. 16, 1982  Sheet 3 of 3  4,316,236
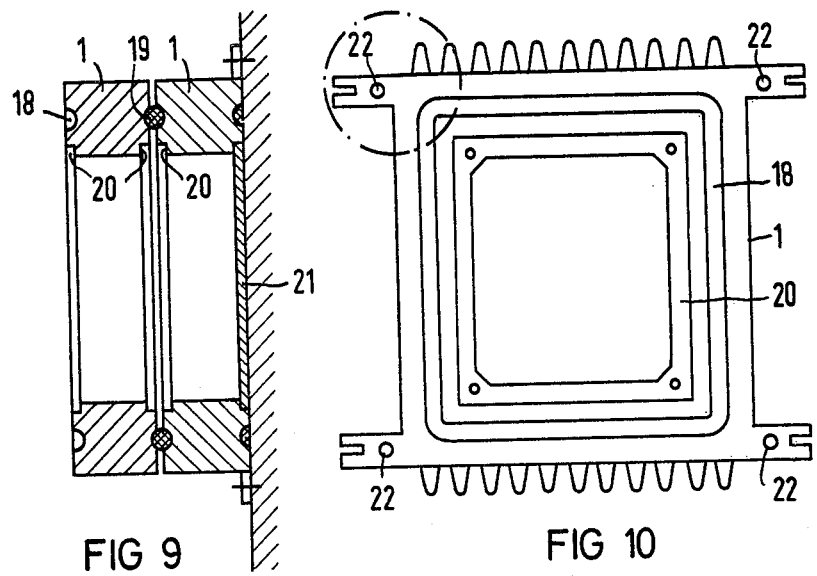
FIG 9
FIG 10
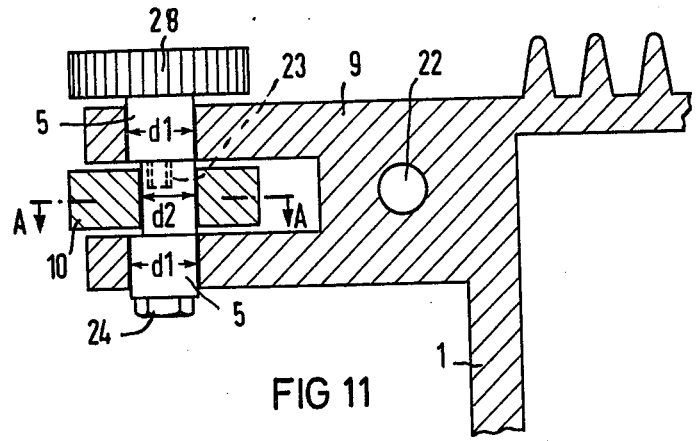
FIG 11
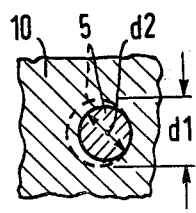
FIG 12

HINGED SUPPORT FOR ELECTRICAL DEVICES

BACKGROUND OF THE INVENTION

1. Field of the Invention

The present invention relates to a swinging mounting structure for electronic devices.

2. Discussion of the Prior Art

A mounting structure of this type is described in German Offenlegungsschrift 21 38 375, taking the form of four racks which accommodate chassis and are fastened to a center wall. Two of these racks are movable out of their intended operating position on hinges. In this construction, an unpivoted support is associated with each pivoted support, and each such pair of supports requires a separate wall element for mounting.

It is an object of the invention, in a construction of the above mentioned kind, to achieve easy accessibility to a greater number of supports while using a minimum of wall elements for supporting the structure and in so doing, to assure great flexibility, i.e., adaptability to prevailing requirements, by simple means.

SUMMARY OF THE INVENTION

According to the present invention, this problem is successfully solved by providing carriers which consist of adjacent, structurally identical, rectangular frames which have right-angle lugs, on at least one side, and are hinged, by means of pins, to corresponding lugs of adjacent frames.

BRIEF DESCRIPTION OF THE DRAWINGS

FIG. 9 is a view, in cross-section, of a pair of splash-proof frames, according to the teachings of the invention;

FIG. 10 is a front view of one of the frames shown in FIG. 9; and

FIGS. 11 and 12 are partial front and plan views, in cross-section, of a frame of FIG. 10, taken in the region of the dashed circle, and showing detail of the clamping and hinge structure.

DETAILED DESCRIPTION OF THE INVENTION

Figure 1:
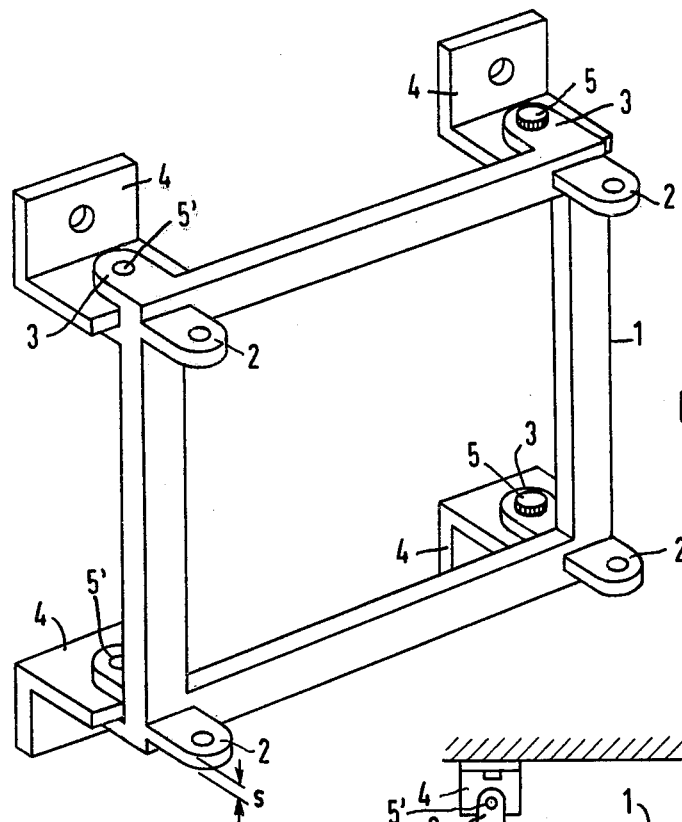
FIG. 1 is a perspective view of an illustrative embodiment of the invention.

FIG. 1 is a perspective view of an embodiment of a mounting structure according to the invention, such as may preferably be used for an open construction. In it, a rectangular frame 1 is made of rectangular or L-section stock, onto which electrical or electronic devices, not shown, such as circuit boards carrying electronic components, can be mounted. Frame 1 has, at each of its four corners, lugs 2 and 3, respectively, which project outwards on both sides of, and at right angles to, the plane of frame 1. Right-angle lugs 3, which are located on one side of frame 1, lie on either side of slot-shaped recesses which correspond in thickness to the thickness S of right angle lugs 2. Lugs 2 are located on the other side of the frame. Right angle lugs 2 and 3 are provided with matching holes. Mounting angle brackets 4, which penetrate the slot shaped recesses of lugs 3 and are connected to them by pins 5 and 5', serve to fix frame 1 to a wall element. Pin 5 is removable and removal is made easier, for instance, by designing the head of pin 5 as a knurled disc. In addition, pin 5 may be provided with a thread for engaging a thread on mounting angle bracket 4 or an internal thread provided on the lower one of the pair of lugs 3.

Figure 2:
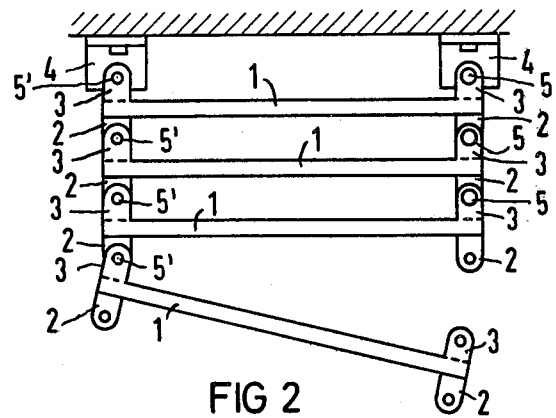
FIG. 2 is a top view of several, adjacent frames hinged to each other.

FIG. 2 is a top view showing several adjacent frames 1 hinged to each other by means of pins 5 and 5', respectively. Adjacent frames are interconnected by a slot and key joint in which a right angle lug 2 engages one or more right-angle lugs 3, on the adjacent frame. After removal of hinge pins 5, the respective frames can be flipped to one side like a book, as shown by the example of the outermost frame. As a matter of course, hinge pins 5' may also be designed so as to be removable, if there is a need to flip the frames to the other side. The construction can be arbitrarily expanded towards the front by adding additional frames, the limit being determined by the mechanical strength of the right angle lugs and their cooperating pins.

Figure 3:
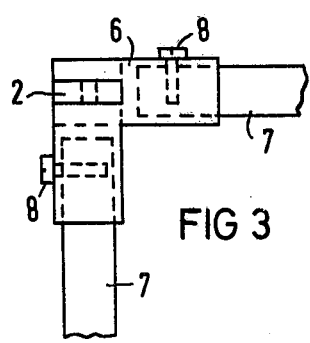
FIGS. 3 and 4 illustrate an embodiment of the invention in which the frame size may be modified.
Figures 4, 7:
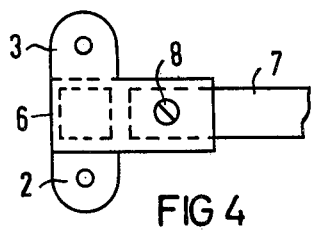

According to the invention, increased flexibility of construction is achieved by the structure shown in FIGS. 3 and 4, in which corner connectors 6 are provided with right angle lugs 2 and 3 (as in FIG. 1), into which two frame legs 7 are plugged, being positively fastened perpendicular to each other. Screws 8 are provided for safety and may not be necessary in some circumstances. This structure makes it possible to adapt the frame dimensions to the requirements of a particular application.

Figures 5, 6:
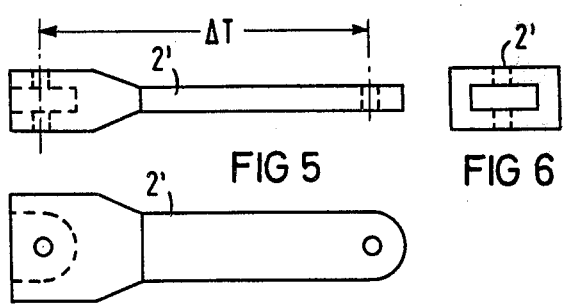
FIGS. 5 to 7 are views of an extrusion part which is useful in the practice of the invention.

When components having considerable structural height, such as transformers, contactors, and the like, are to be accommodated in the frames and it becomes necessary to space the frames somewhat further apart, extension parts 2', shown in FIGS. 5 to 7, may be used to advantage. They are attached to right angle lugs 2, by means of form fitting recesses for receiving tongues 2. The design of the outer end of extension parts 2' is identical with that of right angle lugs 2 so that the mutual spacing of two frames can be increased by the distance $\Delta T$ between pin holes.

Figure 8:
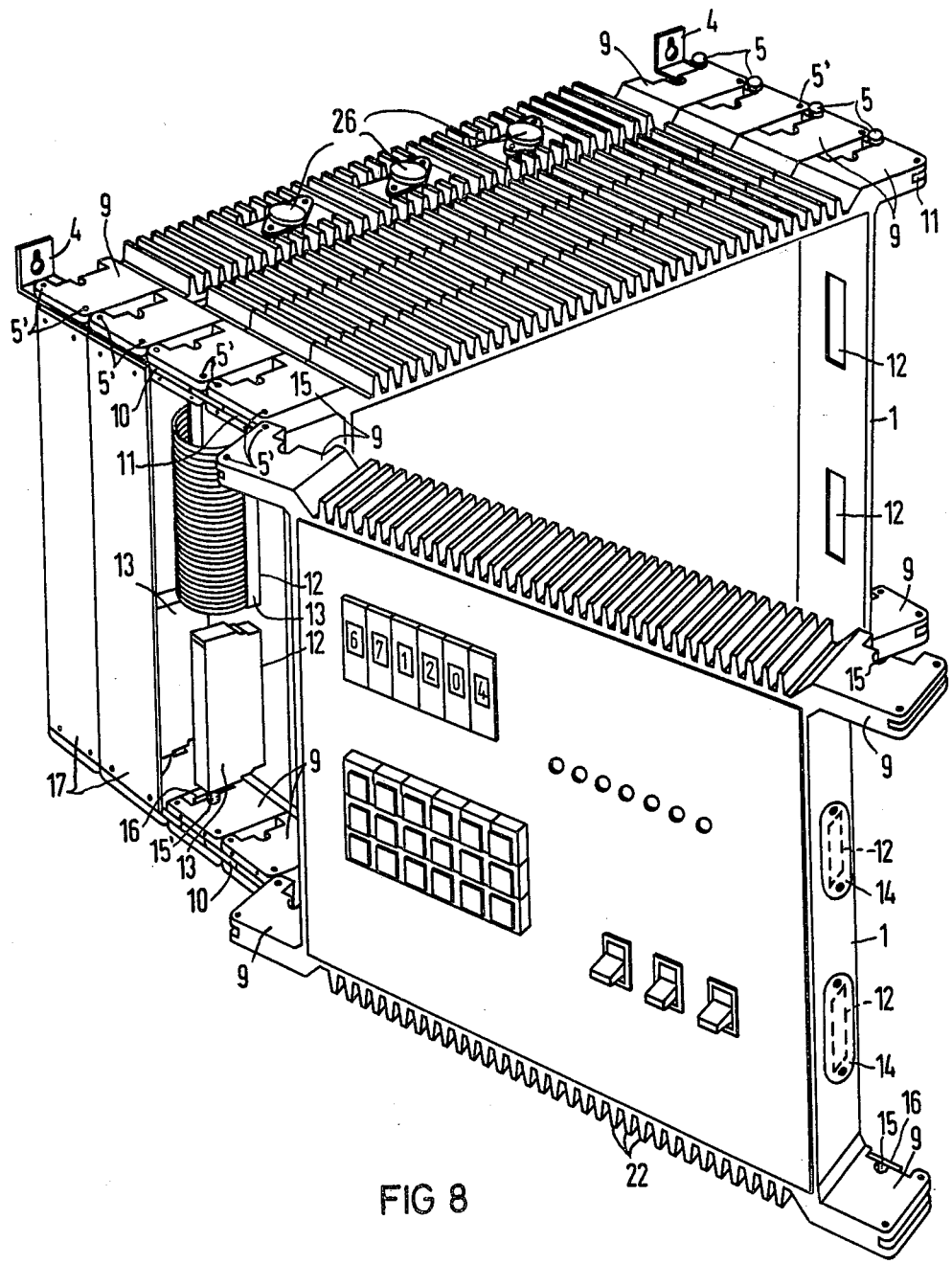
FIG. 8 is a perspective view of an embodiment of the invention providing a closed structure.

FIG. 8 shows an embodiment of the mounting structure of the invention for use where a closed design is required. Here, right-angle lugs 9 extend end-wise from the frame sides, lying in the plane of the frames, each being hinged to the corresponding right angle lug on the next adjacent frame by means of hinge bars 10. Hinge bars 10 are received in slots 11 of appropriate size in right angle lugs 9 and are connected in them by means of hinge pins 5 and 5'. Again, the hinge pins may be designed for easy removability at either or both frame ends, permitting the individual frames to pivot about one or the other pivot axis, appropriately fixed by the hinge pin not removed. In the case of the rearmost frame, attachment angle brackets 4 are used instead of hinges for mounting the carrier frames; they are connected to the frame by means of bolts or screws in a geometry similar to that shown in FIG. 1. A covering wall is provided on the outside of the rearmost and the frontmost frame so that when closed, the frame construction forms a housing which encloses the devices on all sides. It is advantageous for the frame parts as well as the front and rear wall to be made of a metal such as steel or aluminum. A shield may thus be provided against magnetic and electric fields in the case of steel, and electric fields, in the case of aluminum. If the interference protection requirements are more stringent, each individual frame may also be provided with a metallic front and rear wall. Cut-outs 12 are provided in frames 1 for passage of electric connecting elements into the interior of the frame housing for the purpose of interconnecting the electrical devices mounted in the frames. To assure flexibility, like cut-outs are also provided on the right side of the frame, being closed in the example shown, by removable covers 14, as they are not used in this instance.

Right angle lugs 9, which abut, flush, against each other when the frames are closed, are provided with recesses 15 to fit the dimensions of connecting cables 15' coming in from the outside to connector elements 13, thus serving, in conjunction with a clamping plate 16 for each recess in use, to secure and stress-relieve these cables.

It may also be seen in FIG. 8 that the two long legs of each frame are provided with cooling fins and that, for better removal of heat, transistors 26 are mounted on the outside of the frame, with their connecting terminals being let into the interior of the frame. In addition, one or more air channels extending the length of a frame may be provided for better cooling. In this case, the frame depth relative to the width of right angle lugs 9 is reduced, for a given section, as indicated in FIG. 8 on the frame which is next to the rear.

When the frames are closed, right-angle lugs 9 form a U-shaped housing channel for accommodating plug elements 13. When more protection is required, this channel part is closed by means of cover plates 17 extending between, and fastened to, the ends of lugs 9, as shown in FIG. 8 in the two frames furthest back.

FIGS. 9 and 10 show an embodiment of the invention in which the frame housing is provided with spray and water protection. A semicircular groove 18 extends all around opposite, mating faces of the frame for receiving a correspondingly shaped elastic seal 19. As may also be seen from the cross sectional view of FIG. 9, peripheral recesses 20 are provided in the faces of frames which receive a rear panel 21 or a front panel (not shown). To insure that individual frames are firmly pressed together against the seal between them, holes 22, are provided, which run through all frames, perpendicular to the plane of the frames, and which, when the frames are closed, are in alignment with each other for receiving clamping bolts of a length appropriate to total structural depth of the frame housing.

To insure that the required contact pressure is provided either along, or in connection with, the above mentioned clamping bolts, the structure of FIG. 11 is provided. FIG. 11 shows an enlarged sectional view of the frame part located within the dash-dotted circle in FIG. 10. Hinge pin 5 is shown here as having a two-part design; its upper part is connected to its lower part by means of a threaded connection 23. As shown, the lower part of hinge pin 5 is provided with a reduced diameter d2 in the region which passes through hinge bar 10, and it is of a larger diameter d1 in its remaining portions. In addition, the central part of hinge pin 5, e.g., the part having the diameter d2, is made eccentric relative to the parts having the diameter d1, as is evident from the sectional view taken along lines A—A of FIG. 11 and shown in FIG. 12. The upper part of hinge pin 5, which carries knurled disc 28, is screwed into the lower part of the hinge pin by means of a right-handed pin thread 23. When pin thread 23 is right-handed, sufficient contact pressure between the individual housing frames is obtained by turning hinge pin 5 clockwise, given appropriate eccentricity of the pin sections. The hex head which is formed on the lower end of pin 5 facilitates disassembly of the two parts and, thereby, removal of pin 5 for the purpose of opening up the frame. Hinge pin 5 need not be of two-part design if the hole in hinge 10 is of the diameter d1 instead of diameter d2, as shown. In this case, however, the area transmitting the contact pressure becomes slightly smaller.

Overall, an extremely compact, flexible construction adaptable without difficulty to the most varied requirements is achieved by the invention.

What is claimed is:

1. A swinging mounting for electronic and electrical devices comprising:
    at least two structurally similar rectangular frames adjacent to each other in spaced parallel relationship, each frame comprising a top leg, a bottom leg and two side legs, defining a plane, and
    plural hinge joints connecting each side of one frame to the adjacent side of the other frame, each joint comprising:
    at least a first right-angled lug mounted on one frame,
    second and third right-angled lugs mounted on the second frame opposite the first lug, the second and third lugs being spaced apart to provide a slot for receiving a hinge bar, each of the lugs extending laterally outward in the plane of the frame on which the lug is mounted,
    matching holes in the lugs,
    a hinge bar interconnecting the right-angled lugs in each joint, each hinge bar comprising two ends and having a hole in each end which matches the holes in the right-angled lugs and one end of the hinge bar extending into the slot, and
    first and second pivot pins in the holes in each hinge bar for connecting one end of the hinge bar to the first lug and the other end of the hinge bar to the second and third lugs, the first pin in each hinge bar on one side of the frame being easily removable and the second pin in each hinge bar on said one side of the frame being either fixed against removal or easily removable, and the pins in each hinge bar at the other side of the frame being either fixed against removal or easily removable.

2. A mounting in accordance with claim 1 in which at least one frame has a predetermined depth and the length of each slot provided on the frame for receiving a hinge bar is substantially equal to the predetermined depth, there being a hole at each end of each slot for receiving a pivot pin.

3. A mounting in accordance with claim 1 in which the top, bottom, and side legs of each frame, when the frames are closed, comprise walls of a housing for enclosing electric devices, there being an outermost frame and an innermost frame, the housing further comprising:
    a front wall and a rear wall attached to the outermost and to the innermost frames, respectively.

4. A mounting in accordance with claim 3 in which the housing is made of metal.

5. A mounting in accordance with claim 4, further comprising:
    an intermediate metallic wall attached to the outermost frame and an intermediate metallic wall attached to each inner frame.

6. A mounting in accordance with claim 3 in which one frame has a face opposite a mating face on the adjacent frame and further comprising:
   a groove in at least one of the faces which extends all around the face and is adapted to receive an elastic seal.

7. A mounting in accordance with claim 3, and further comprising:
   a hole in each frame which is perpendicular to the plane of the frame, each hole being, when the frames are closed, in alignment with the corresponding hole in each adjacent frame to provide a passage for a clamping bolt to press the frames together.

8. A mounting in accordance with claim 6 in which one pivot pin in each joint connecting adjacent frames on at least one side comprises:
   a rotatable body having substantially cylindrical coaxial end portions of a diameter matching the holes in the second and third lugs and a central portion of reduced cross-section which is adapted to fit in and bear on the hole in the first lug, the central portion being off center with respect to the end portions.

9. A mounting in accordance with claim 3 in which at least one frame leg has at least one cutout for receiving an electric connector element.

10. A mounting in accordance with claim 3 in which:
    the top, bottom, and side legs of each frame meet at respective corners and each corner has a laterally projecting right-angled lug having parallel sides;
    the sides of the lug at each corner lie parallel to the sides of the corresponding lug on the adjacent frame and adjacent sides of adjacent lugs are in abutting, flush relationship; and
    at least one side of one lug includes a recess for receiving a cable.

11. A mounting in accordance with claim 10 in which the laterally projecting right-angled lugs at the corners of at least one side of at least one of the frames have exposed end surfaces, and further comprising:
    a cover plate mounted between the end surfaces.

12. A mounting in accordance with claim 4 comprising:
    cooling fins on at least two opposite legs of a frame.

13. A mounting in accordance with claim 4 in which at least one aperture is provided in at least one frame leg for receiving at least one terminal of an electrical component, and further comprising:
    means on the outside of the frame leg for mounting the electrical component.

14. A mounting in accordance with claim 10 in which at least one frame has a lesser depth than the other frame and the distance between the parallel sides of the right-angled lugs on each such frame is greater than the reduced depth, and further comprising:
    a rear wall and a front wall on each frame.

15. A mounting in accordance with claim 1, and further comprising:
    an extension part connected between the lugs of corresponding joints on adjacent frames for increasing the spacing between the frames, each extension part comprising a body having a first end, adapted to conformably receive at least the first right-angled lug, and a second end having a thickness equal to the spacing between the second and third right-angled lugs on the adjacent frame, each end having a hole matching the holes in the lugs and connected thereto by a pivot pin.

* * * * *